United States Patent
Zhang et al.

(10) Patent No.: US 11,832,405 B2
(45) Date of Patent: Nov. 28, 2023

(54) ROTATING MODULE AND ELECTRONIC DEVICE

(71) Applicant: Beijing Xiaomi Mobile Software Co., Ltd., Beijing (CN)

(72) Inventors: Xuehu Zhang, Beijing (CN); Xianli Cao, Beijing (CN)

(73) Assignee: BEIJING XIAOMI MOBILE SOFTWARE CO., LTD., Beijing (CN)

( * ) Notice: Subject to any disclaimer, the term of this patent is extended or adjusted under 35 U.S.C. 154(b) by 142 days.

(21) Appl. No.: 17/454,191

(22) Filed: Nov. 9, 2021

(65) Prior Publication Data
US 2022/0377919 A1 Nov. 24, 2022

(30) Foreign Application Priority Data
May 18, 2021 (CN) .......................... 202110539121.3

(51) Int. Cl.
| | |
|---|---|
| H05K 5/02 | (2006.01) |
| F16C 11/04 | (2006.01) |
| E05D 3/12 | (2006.01) |
| G06F 1/16 | (2006.01) |

(52) U.S. Cl.
CPC ............ H05K 5/0226 (2013.01); F16C 11/04 (2013.01); E05D 3/122 (2013.01); E05Y 2900/606 (2013.01); G06F 1/1616 (2013.01)

(58) Field of Classification Search
CPC . H05K 5/0226; F16C 11/04; E05Y 2900/606; E05D 3/122; G06F 1/1616
See application file for complete search history.

(56) References Cited

U.S. PATENT DOCUMENTS

| | | | | |
|---|---|---|---|---|
| 10,761,573 B2* | 9/2020 | Hsu | .................... | G06F 1/1681 |
| 10,983,569 B2* | 4/2021 | Lin | .................... | G06F 1/1616 |
| 11,016,541 B2* | 5/2021 | Lin | .................... | E05D 3/122 |
| 11,301,006 B2* | 4/2022 | Hsu | .................... | G06F 1/1641 |
| 11,320,871 B2* | 5/2022 | Lin | .................... | E05D 11/1014 |
| 11,353,931 B2* | 6/2022 | Hsu | .................... | G06F 1/1681 |
| 11,408,214 B1* | 8/2022 | Hsu | .................... | E05D 3/18 |
| 11,459,809 B1* | 10/2022 | Hsu | .................... | E05D 3/122 |

(Continued)

FOREIGN PATENT DOCUMENTS

| | | |
|---|---|---|
| CN | 207018340 U | 2/2018 |
| EP | 3674836 A1 | 7/2020 |

(Continued)

*Primary Examiner* — Victor D Batson
*Assistant Examiner* — Matthew J Sullivan
(74) *Attorney, Agent, or Firm* — McCoy Russell LLP

(57) ABSTRACT

A rotating module is provided and includes two rotating arms, and a bracket having a track groove and located between the two rotating arms. Each rotating arm includes a first rotating piece, a first end of which is located in the track groove; and a second rotating piece connected with the bracket and a second end of the first rotating piece respectively. In a folded state, a rotation center of the first rotating piece is a first position on the groove wall of the track groove; in an unfolded state, the rotation center of the first rotating piece is a second position on the groove wall of the track groove. The second position is located between a center position of the track groove and the first position, and the rotation center of the first rotating piece is one rotation center of the rotating arm.

10 Claims, 3 Drawing Sheets

(56) References Cited

U.S. PATENT DOCUMENTS

| | | | |
|---|---|---|---|
| 11,624,221 B1* | 4/2023 | Hsu | E05D 3/122 |
| | | | 16/354 |
| 2022/0159109 A1* | 5/2022 | Kang | G06F 1/1681 |
| 2022/0253110 A1* | 8/2022 | Choi | G06F 1/1681 |
| 2022/0282754 A1* | 9/2022 | Zhang | F16C 11/04 |
| 2022/0365568 A1* | 11/2022 | Torres | E05D 11/06 |
| 2022/0365569 A1* | 11/2022 | Hsu | F16C 11/04 |
| 2022/0400565 A1* | 12/2022 | Shin | G06F 1/1616 |
| 2022/0412138 A1* | 12/2022 | Peng | G06F 1/1681 |
| 2023/0014585 A1* | 1/2023 | Tang | E05D 3/122 |
| 2023/0050832 A1* | 2/2023 | Yang | H05K 5/0017 |

FOREIGN PATENT DOCUMENTS

| | | |
|---|---|---|
| EP | 3734946 A1 | 11/2020 |
| WO | 2020186889 A1 | 9/2020 |

* cited by examiner

ROTATING MODULE AND ELECTRONIC DEVICE

CROSS-REFERENCE TO RELATED APPLICATION

This application claims priority to Chinese Patent Application No. 202110539121.3 filed on May 18, 2021, the entire contents of which are incorporated herein by reference.

BACKGROUND

In terms of a current development trend of electronic products, folding screen mobile phones, folding screen computers and the like will become the future development trend. For folding mobile phone products, a rotating module is very important, and the performance of the rotating module will directly affect the function and experience of the entire product. Most of current rotating modules are folded at a single angle. For example, a rotating module includes two rotating arms and a bracket located between the two rotating arms. There are totally three sections of structures. When in use, the two rotating arms rotate about 91° relative to the bracket respectively to achieve a folded state of the rotating module. In such a single-angle folded rotating module, the rotating arms are not able to effectively avoid the folding screen, which easily causes the folding screen to bend unnaturally, and the folding screen is easily damaged.

SUMMARY

The present disclosure relates to the technical field of electronic devices, and relates to a rotating module and an electronic device.

According to a first aspect of an embodiment of the present disclosure, a rotating module is provided, including:
  two rotating arms; and
  a bracket, having a track groove, and located between the two rotating arms, wherein the rotating arms are capable of rotating around the bracket with rotation centers of the rotating arms.
  each rotating arm includes:
    a first rotating piece, wherein a first end of the first rotating piece is located in the track groove; and
    a second rotating piece, rotatably connected with the bracket and a second end of the first rotating piece respectively. The second end is an opposite end of the first end.
  When the rotating module is in a folded state, a rotation center of the first rotating piece is a first position on a groove wall of the track groove;
  when the rotating module is in an unfolded state, the rotation center of the first rotating piece is a second position on the groove wall of the track groove, and the second position is located between a center position of the track groove and the first position; and
  the rotation center of the first rotating piece is one rotation center of the rotating arm.

According to a second aspect of an embodiment of the present disclosure, an electronic device is provided, including:
  a first shell;
  a second shell; and
  a rotating module;
  the rotating module includes:
    two rotating arms; and
    a bracket, having a track groove and located between the two rotating arms, wherein the rotating arms are capable of rotating around the bracket with rotation centers of the rotating arms; wherein
    each rotating arm includes:
      a first rotating piece, a first end of the first rotating piece is located in the track groove; and
      a second rotating piece, rotatably connected with the bracket and a second end of the first rotating piece respectively, wherein the second end is an opposite end of the first end;
    when the rotating module is in a folded state, a rotation center of the first rotating piece is a first position on a groove wall of the track groove;
    when the rotating module is in an unfolded state, the rotation center of the first rotating piece is a second position on the groove wall of the track groove, and the second position is located between a center position of the track groove and the first position; and
    the rotation center of the first rotating piece is one rotation center of the rotating arm;
  The first shell and the second shell are respectively connected with one of the rotating arms.

BRIEF DESCRIPTION OF THE DRAWINGS

The accompanying drawings, which are incorporated in and constitute a part of this specification, illustrate embodiments consistent with the present disclosure and together with the specification serve to explain the principles of the present disclosure.

DETAILED DESCRIPTION

Figure 1:
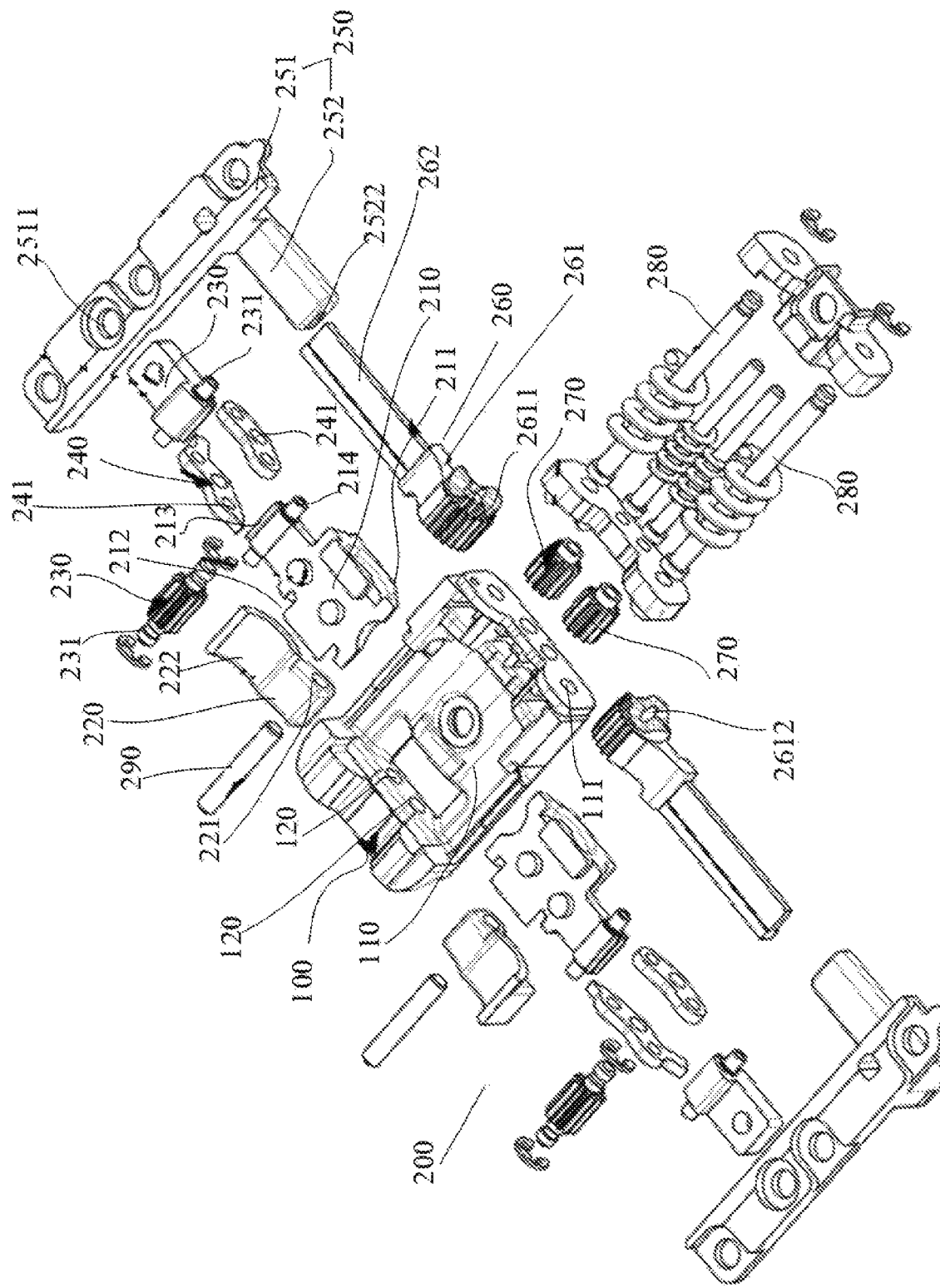
FIG. 1 is an exploded view of a rotating module illustrated according to one or more examples of the present disclosure.

Embodiments will be described in detail herein, examples of which are illustrated in the accompanying drawings. When the following description refers to the accompanying drawings, the same numbers in different drawings represent the same or similar elements unless otherwise indicated. The implementations described in the following embodiments do not represent all implementations consistent with the present disclosure. On the contrary, they are merely examples of an apparatus and a method consistent with some aspects of the present disclosure.

In the description of the present disclosure, it should be understood that orientations or positional relationships indicated by the terms "center", "upper", "lower", "top", "bottom", "inner", "outer" and the like are based on the orientation or positional relationship where a user is located when using a rotating module.

An embodiment of the present disclosure provides a rotating module, the rotating module includes:
  two rotating arms 200; and
  a bracket 100, having a track groove 110, and located between the two rotating arms 200. The rotating arms 200 are capable of rotating around the bracket 100 with rotation centers of the rotating arms 200.

each rotating arm 200 includes:

a first rotating piece 210, a first end 211 of the first rotating piece 210 is located in the track groove 110; and a second rotating piece 220, rotatably connected with the bracket 100 and a second end 212 of the first rotating piece 210 respectively. The second end 212 is an opposite end of the first end 211;

when the rotating module is in a folded state, a rotation center of the first rotating piece 210 is a first position on a groove wall of the track groove 110;

when the rotating module is in an unfolded state, the rotation center of the first rotating piece 210 is a second position on the groove wall of the track groove 110, and the second position is located between a center position of the track groove 110 and the first position; and the rotation center of the first rotating piece 210 is one rotation center of the rotating arm 200.

Technical solutions provided by the embodiments of the present disclosure may include the following beneficial effects:

The second rotating piece of each rotating arm in the present disclosure is capable of not only mutually rotating with the bracket, but also mutually rotating with the second end of the first rotating piece, and the first end of the first rotating piece is able to rotate at different positions on the groove wall of the track groove of the bracket. That is, the rotation centers of each rotating arm at least include a rotation center between the second rotating piece and the bracket, a rotation center between the first rotating piece and the second rotating piece, and a rotation center between the first rotating piece and the bracket. Through the cooperation of the first rotating piece, the second rotating piece and the bracket, in an unfolded state, the rotation center of the first end of the first rotating piece relative to the bracket is closer to the center position of the track groove, and in a folded state, the rotation center of the first end of the first rotating piece relative to the bracket is farther from the center position of the track groove, i.e. the rotation center of the first end of the first rotating piece relative to the bracket is closer to the edge of the track groove. At the moment, relative to the unfolded state, in the folded state, the first end of the first rotating piece is farther from a maximum deformation position of a folding screen, and the damage to the folding screen is reduced. Therefore, through a rotation mode that the rotation center of the first rotating piece and the track groove is changed, the first rotating piece is able to better adapt to the natural bending of the folding screen, and the protective effect on the folding screen is improved.

Figure 2:
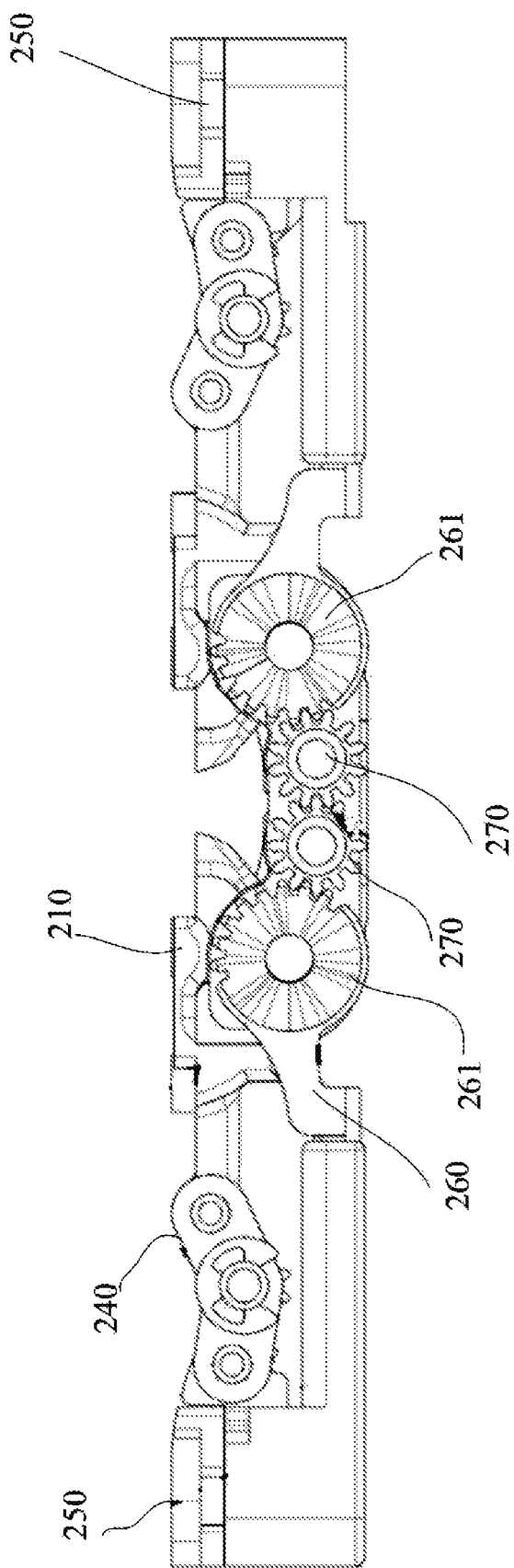
FIG. 2 is a schematic structural diagram of a rotating module illustrated according to one or more examples of the present disclosure (in an unfolded state)
Figure 3:
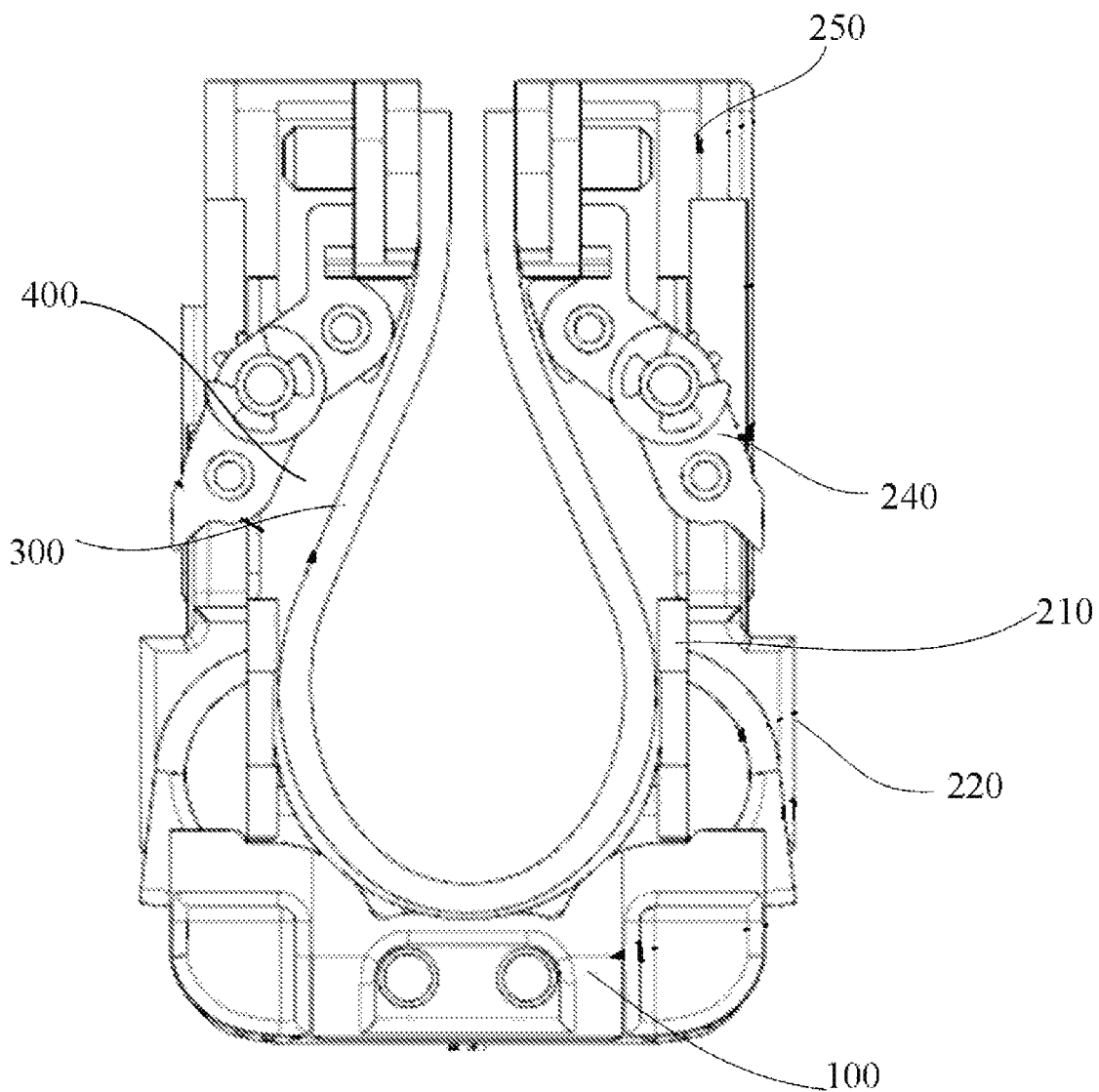
FIG. 3 is a schematic structural diagram of a rotating module illustrated according to one or more examples of the present disclosure (in a folded state).

As shown in FIGS. 1-3, the second rotating piece 220 of each rotating arm 200 is capable of not only mutually rotating with the bracket 100, but also mutually rotating with the second end 212 of the first rotating piece 210, and the first end 211 of the first rotating piece 210 is capable of rotating at different positions on the groove wall of the track groove 110 of the bracket 100. That is, the rotation centers of each rotating arm 200 at least include a rotation center between the second rotating piece 220 and the bracket 100, a rotation center between the first rotating piece 210 and the second rotating piece 220, and a rotation center between the first rotating piece 210 and the bracket 100. When the second rotating piece 220 relatively rotates with the bracket 100, the first rotating piece 210 is also driven to rotate relative to the second rotating piece 220, and the first rotating piece 210 is driven to rotate in the track groove 110 as well.

The rotation center between the second rotating piece and the bracket is relatively fixed, and the rotation center between the first rotating piece and the second rotating piece is relatively fixed as well, but the rotation center between the first rotating piece and the bracket changes within a preset range. For the single rotating arm, the preset range may be any range between the center position of the track groove and an edge position of the track groove. Specifically, in the unfolded state and the folded state, the rotation center between the first rotating piece and the bracket is respectively two extreme positions in the preset range. Between the unfolded state and the folded state, the rotation center of the first end 211 of the first rotating piece is located between the first position and the second position.

In some embodiments, the first end 211 of the first rotating piece 210 has arc-shaped outer surface, and the arc-shaped outer surface is in contact with the groove wall of the track groove 110. As shown in FIG. 1, the groove wall of the track groove 110 is matched with the arc-shaped outer surface, i.e. the shape of a cross section of the track groove 110 is roughly the same as the shape of cross section of the first end 211 of the first rotating piece 210, so as to guarantee that the first end 211 of the first rotating piece 210 is able to smoothly rotate in the track groove 110.

As shown in FIGS. 2 and 3, in the unfolded state, the rotating arms 200 are able to support a folding screen, and in the folded state, a certain space may be reserved for the bent folding screen so as to reduce the extrusion on the folding screen. In practical application, as shown in FIG. 2, the unfolded state refers to that: an angle between the two rotating arms 200 is approximately 180°. When applied to an electronic device, the folding screen 300 of the electronic device is in an exposed state. At the moment, a user may obtain large-screen display. As shown in FIG. 3, the folded state refers to that: the angle between the two rotating arms 200 is approximately 0°. When applied to the electronic device, the folding screen 300 of the electronic device is in a concealed state. Both the two rotating arms 200 may rely on the relative rotation of the second rotating piece 220 and the bracket 100 to achieve the folded state or the unfolded state.

As shown in FIG. 3, for the second rotating piece 220, the first rotating piece 210 may directly apply acting force on the folding screen 300. The deformation of the folding screen 300 in a folding region (also referring to a part where the folding screen 300 is aligned with the bracket 100) is relatively large. In the rotating process from the unfolded state to the folded state, the rotation center of the first end 211 of the first rotating piece 210 may gradually move to an edge of the track groove 110. In the process, the first rotating piece 210 will avoid the folding screen 300, so that the acting force of the second rotating piece 220 on the folding screen 300 is reduced, even the second rotating piece 220 has no acting force on the folding region of the folding screen 300. Therefore, the stress on the folding region of the folding screen 300 generated by the external force is reduced, and the protective effect on the folding screen 300 is improved.

Therefore, in the embodiment of the present disclosure, through the cooperation of the first rotating piece 210, the second rotating piece 220 and the bracket 100, in the unfolded state, the rotation center of the first end 211 of the first rotating piece 210 relative to the bracket 100 is closer to the center position of the track groove, and in the folded state, the rotation center of the first end 211 of the first rotating piece 210 relative to the bracket 100 is farther from the center position of the track groove, i.e. the rotation center of the first end 211 of the first rotating piece 210 relative to the bracket 100 is closer to the edge of the track groove. At the moment, relative to the unfolded state, the first end 211 of the first rotating piece 210 is farther from a maximum deformation position of the folding screen 300, and the damage to the folding screen 300 is reduced. Through a rotation mode that the rotation center of the first rotating piece 210 and the track groove 110 is changed, the first rotating piece 210 is able to better adapt to the natural bending of the folding screen 300, and the protective effect on the folding screen 300 is improved.

In some embodiments, a degree of freedom of a rotating pair formed by the first rotating piece 210 and the track groove 110 of the bracket 100 is larger than a degree of freedom of a rotating pair formed by the first rotating piece 210 and the second rotating piece 220; similarly, the degree of freedom of the rotating pair formed by the first rotating piece 210 and the track groove 110 of the bracket 100 is also larger than a degree of freedom of a rotating pair formed by the second rotating piece 220 and the bracket 100. For example, the second rotating piece 220 is in surface fit with the bracket 100, the second rotating piece 220 is in surface fit with the second end 212 of the first rotating piece 210, and the first end 211 of the first rotating piece 210 may be in point fit or line fit with the track groove 110. At the moment, a similar connecting rod mechanism is formed among the bracket 100, the second rotating piece 220 and the first rotating piece 210.

Unrestrictedly, when changing between the unfolded state and the folded state, a connecting line of rotation centers of the first end 211 of the first rotating piece 210 at different moments is roughly in an arc shape.

Unrestrictedly, the groove wall of the track groove 110 is in an arc shape. The arc shape may be a circular arc shape or a non-circular arc shape. For example, the groove wall of the track groove is in the non-circular arc shape. For example, the groove wall of the track groove is roughly in an elliptic arc shape, or in a parabolic shape.

In other optional embodiments, the groove wall of the track groove 110 has: a first mounting hole 120;

the second rotating piece 220 has: an axle hole 221 aligned with the first mounting hole 120; and the rotating module further includes: a central spindle 290. The central spindle 290 penetrate through the first mounting hole 120 and the axle hole 221.

As shown in FIG. 1, the second rotating piece 220 may achieve mutual rotation with the bracket 100 through the cooperation of the central spindle 290 and a shaft sleeve.

In practical application, the central spindle may form a conjoined structure with a hole wall of the first mounting hole or a hole wall of the axle hole in a mode of molding or machining.

In other optional embodiments, the second rotating piece 220 further has: a groove 222, and a groove wall of the groove 222 is in a circular arc shape; and the second end 212 of the first rotating piece 210 is located in the groove 222.

In the embodiment of the present disclosure, while the second rotating piece 220 rotate relative to the bracket 100, the second end 212 of the first rotating piece 210 is driven to move along the groove wall of the groove 222. Because the groove wall of the groove 222 is in the circular arc shape, the motion track of the first rotating piece 210 in the groove 222 is circular arcs, i.e. the rotation of the first rotating piece 210 relative to the second rotating piece 220 is realized.

In some embodiments, a part of the outer surface of the second end 212 of the first rotating piece 210 facing towards the groove 222 is in a circular arc shape. The first rotating piece 222 with the circular arc-shaped outer surface is matched with the groove wall of the groove 222 so that the second end 212 of the first rotating piece 210 is capable of rotating more smoothly in the groove 222.

As shown in FIG. 1, the groove wall of the groove 222 is in a semi-circular arc shape.

In other optional embodiments, the first rotating piece 210 further includes:

a first tooth part 213, located in a region other than the first end 211 and the second end 212 of the first rotating piece 210; and the rotating arm 200 further includes:

a first gear structure 230, meshing with the first tooth part 213.

In the embodiment of the present disclosure, the first tooth part 213 and the first gear structure 230 at least includes two teeth, and the first tooth part 213 meshes with the first gear structure 230.

The first rotating piece is located between the bracket and the first gear structure, and during the relative rotation of the first rotating piece and the bracket, the first gear structure is driven to rotate through meshing of the first tooth part and the first gear structure. A rotation center is formed by meshing of the first gear structure and the first rotating piece, and when there are at least two first gear structures, the two first gear structures are in meshing connection. At the moment, a rotation center is formed between the two first gear structures as well, so the rotation centers of the rotating arms are increased through the cooperation of the first gear structure and the first rotating piece. The plurality of rotation centers of each rotating arm further inhibit the stress concentration during the folding process, which is beneficial to reduce the damage to the folding screen.

In the folded state, through the rotation of the rotating arm at position of the first gear structure, the two rotating arms may be further away from the folding screen, so the extrusion of the two rotating arms on the folding screen in the folded state is reduced. As shown in FIG. 3, at the position of the first gear structure 230, there is a space 400 between the two rotating arms 200 and the folding screen 300.

Unrestrictedly, as shown in FIG. 3, the rotating module of the embodiment of the present disclosure can realize drop-shaped folding of the folding screen 300, which reduces the gaps in other regions other than the folding region of the folding screen 300.

The number of the first gear structure 230 of each rotating arm 200 may be one or at least two. As shown in FIG. 1, when each rotating arm 200 includes at least two first gear structures 230, the first gear structures 230 may be of the same structure or different structures, the two adjacent first gear structures 230 mesh with each other, and one first gear structure 230 meshes with the first tooth part 213. For example, as shown in FIG. 1, each rotating arm 200 includes two first gear structures 230, one of the first gear structures 230 is a columnar gear, the other first gear structure 230 is rod-shaped, and the columnar first gear structure 230 is located between the first tooth part 213 and the rod-shaped first gear structure 230; and while the columnar first gear structure 230 meshes with the first tooth part 213, and it also meshes with the rod-shaped first gear structure 230.

In other optional embodiments, the first rotating piece 210 further includes: a hinge pin 214; and the rotating module further includes:

a connecting piece 240, having at least two connecting holes 241. The at least two connecting holes 241 respectively accommodate the hinge pin 214 and a gear shaft 231 of the first gear structures 230 to limit the separation of the first gear structure 230 from the first tooth part 213.

As shown in FIG. 1, the hinge pin 214 and the gear shaft 231 of the first gear structure 230 penetrate into the connecting holes 241 at different positions respectively, and the connecting piece 240 enhances the connection between the first gear structure 230 and the first rotating piece 210, so the reliability of meshing of the first tooth parts 213 and the first gear structures 230 are guaranteed.

Unrestrictedly, the connecting piece is a sheet material.

In other optional embodiments, each rotating arm 200 further includes:

a supporting frame 250, connected with the first gear structure 230 and having a mounting position 2511. The mounting position 2511 is configured to be connected with a shell of an electronic device.

As shown in FIG. 1, the supporting frame 250 rotates along with the rotation of the first gear structure 230. When a plurality of first gear structures 230 are provided, one first gear structure 230 may be fixed to the supporting frame 250 in a mode of welding or threaded connection by fasteners such as screws.

As shown in FIG. 3, the supporting frame 250 may be directly in contact with the folding screen and have a supporting effect on the folding screen. Or, the supporting frame 250 is in contact with the folding screen through the shell of the electronic device.

Unrestrictedly, each mounting position 2511 includes: a mounting hole or a mounting groove.

In other optional embodiments, the rotating arm 200 further includes:

a connecting rod 260, having a first part 261 and a second part 262 connected with the first part 261; the first part 261 includes a second tooth part 2611, and the second part 262 is connected with the supporting frame 250; and a second gear structure 270; a gear shaft of the second gear structures 270 is connected with the bracket 100, and the second gear structure 270 meshes with the second tooth part 2611; and the second gear structures 270 of the two rotating arms 200 mesh with each other.

As shown in FIG. 1, each rotating arm 200 includes at least one second gear structure 270. The second tooth part 2611 and the second gear structure 270 each includes at least two teeth, and the second tooth part 2611 meshes with the second gear structure 270.

The folding or unfolding of the two rotating arms 200 may also be realized through the meshing rotation of the second gear structures 270 of the two rotating arms 200. In practical application, the meshing rotation of the two adjacent second gear structures 270 may be synchronized with the rotation of the second rotating piece 220 relative to the bracket 100. Since the second gear structure 270 is connected with the bracket 100, the cooperation of the first rotating piece 210 on the supporting frame 250, the connecting rod 260 and the second gear structure 270 further strengthens the cooperation of the first rotating piece 210 and the bracket 100 so that the first rotation piece 210 can rotate firmly in the track groove 110 without being easily separated from the track groove 110.

It can be understood that the connection between the second part of the connecting rod and the supporting frame is not a fixed connection. For example, the second part of the connecting rod may be slidably connected or rotatably connected with the supporting frame.

In other optional embodiments, the supporting frame 250 includes:

a first supporting frame body 251, having a mounting position 2511 and connected with the first gear structure 230; and a second supporting frame body 252, connected with the first supporting frame body 251 and having a sliding groove 2522; and the second part 262 of the connecting rod 260 is located in the sliding groove 2522.

In the embodiment of the present disclosure, the second part of the connecting rod may slide in the sliding groove, so as to adapt to the meshing rotation of the second gear structure and the second tooth part of the connecting rod.

Unrestrictedly, as shown in FIG. 1, the second supporting frame body and the first supporting frame body 251 are perpendicularly distributed, and the second part 262 of the connecting rod 260 move in the sliding groove 2522 in the arrangement direction of the second supporting frame body 252.

In some embodiments, the second part 262 of each connecting rod 260 has a third saw tooth, the second supporting frame body 252 has a fourth saw tooth, and the third saw tooth meshes with the fourth saw tooth.

In other optional embodiments, the groove wall of the track groove 110 has: a second mounting hole 111;

the connecting rod 260 further has: a through hole 2612; and the rotating module further includes: a lever pin 280, penetrating through the through hole 2612 and the second mounting hole 111; and the lever pin 280 is multiplexed as a rotating shaft of the second tooth part 2611 during meshing rotation.

As shown in FIG. 1, the lever pin 280 is connected with the bracket 100, so the connection between the connecting rod 260 and the bracket 100 is enhanced and the compactness of the rotating module is improved. Further, the lever pin 280 limit the separation of the second tooth part 2611 of the connecting rod 260 from the second gear structure 270, so the reliability of meshing of the second tooth part 2611 and the second gear structure 270 is guaranteed.

An embodiment of the present disclosure further provides an electronic device, the electronic device includes:

a first shell;

a second shell; and the rotating module in any one of the above embodiments; the first shell and the second shell are respectively connected with one of the rotating arms.

Unrestrictedly, the electronic device includes but is not limited to: a mobile phone, a tablet personal computer or a laptop, etc.

When the rotating module is in a folded state, the first shell and the second shell are driven to be in a folded state as well. Similarly, when the rotating module is in an unfolded state, the first shell and the second shell are driven to be in an unfolded state as well.

In some embodiments, the electronic device further includes a folding screen 300. A back face of the folding screen 300 covers the first shell, the rotating module and the second shell. The folding screen 300 may be a flexible screen.

In a specific example, as shown in FIG. 1-3, the bracket 100 is hinged with the second rotating piece 220 through a central spindle 290. A groove wall of the track groove 110 of the bracket 100 has a first mounting hole 120. One end of the second rotating piece 220 has an axle hole 221 and the other end has a circular sliding rail (i.e. a groove 222). The portion of the second end 212 of the first rotating piece 210 facing the groove 222 has an arc-shaped outer surface, and the first rotating piece 210 has a first tooth part 213 and is connected with a hinge pin 214. The first rotating piece 210 is respectively matched with the bracket 100 and the second rotating piece 220, and the first rotating piece 210 may realize variable-rotation-axis rotation within a certain angle relative to the bracket 100. An end part and a middle part of the connecting piece 240 have characteristics of a plurality of connecting holes 241 and are matched with a pin, a synchronizer gear (i.e. one of the first gear structures 230) and a synchronizer gear lever (i.e. the other first gear structure 230). One end of the synchronizer gear lever has characteristics of a gear and a shaft, and the other end has characteristic of a hole. The other end of the synchronizer gear lever is connected with the supporting frame 250 through screws. The supporting frame 250 has characteristic of a sliding groove 2522. The sliding groove 2522 is matched with a synchronizing lever (i.e. the connecting rod 260), and the synchronizing lever may slide in a linear mode relative to the supporting frame 250. An end part of the synchronizing lever has characteristics of a gear and a hole and is hinged with the bracket 100 through a synchronizing lever pin 280. A second tooth part 2611 at the end part of the synchronizing lever meshes with a pinion (i.e. the second gear structure 270) mounted on the bracket 100. The entire hinge structure is left-right symmetrical, and meshes by a pair of second gear structure 270 in the middle, so that the left and the right parts may operate synchronously relative to the bracket 100. As shown in FIGS. 1-3, in the embodiment of the present disclosure, each rotating arm 200 forms eight movable connection parts with the bracket 100. The eight connection parts are respectively: the rotational connection between the second rotating piece 220 and the bracket 100, the rotational connection between the second rotating piece 220 and the first rotating piece 210, the rotational connection between the first rotating piece 210 and the track groove 110, the two rotational connections formed between the two first gear structures 230 and the first rotating piece 210, the rotational connection between the connecting rod 260 and the second gear structure 270, and the linear sliding connection between the connecting rod 260 and the supporting frame 250. In such structure of the rotating module, the plurality of movable connection parts may realize the connection through shaft components such as pins and hinge pins 214. The structure is simple and effective, which is beneficial to reduce the difficulty of production and assembly.

The features disclosed in the several product embodiments provided in the present disclosure can be combined arbitrarily without conflict to obtain new product embodiments.

Those skilled in the art will readily conceive other implementation solutions of the present disclosure after considering the specification and putting the present disclosure disclosed herein into practice. The present disclosure is intended to cover any variations, purposes, or adaptive changes of the present disclosure. These variations, purposes, or adaptive changes conform to a general principle of the present disclosure and include common knowledge or conventional technical means in the technical field that are not disclosed in the present disclosure.

It should be understood that the present disclosure is not limited to the exact structure that has been described above and shown in the drawings, and that various modifications and changes can be made without departing from the scope thereof. The scope of the present disclosure is only limited by the appended claims.

FIGS. 1-3 show example configurations with relative positioning of the various components. If shown directly contacting each other, or directly coupled, then such elements may be referred to as directly contacting or directly coupled, respectively, at least in one example. Similarly, elements shown contiguous or adjacent to one another may be contiguous or adjacent to each other, respectively, at least in one example. As an example, components laying in face-sharing contact with each other may be referred to as in face-sharing contact. As another example, elements positioned apart from each other with only a space therebetween and no other components may be referred to as such, in at least one example. As yet another example, elements shown above/below one another, at opposite sides to one another, or to the left/right of one another may be referred to as such, relative to one another. Further, as shown in the figures, a topmost element or point of element may be referred to as a "top" of the component and a bottommost element or point of the element may be referred to as a "bottom" of the component, in at least one example. As used herein, top/bottom, upper/lower, above/below, may be relative to a vertical axis of the figures and used to describe positioning of elements of the figures relative to one another. As such, elements shown above other elements are positioned vertically above the other elements, in one example. As yet another example, shapes of the elements depicted within the figures may be referred to as having those shapes (e.g., such as being circular, straight, planar, curved, rounded, chamfered, angled, or the like). Further, elements shown intersecting one another may be referred to as intersecting elements or intersecting one another, in at least one example. Further still, an element shown within another element or shown outside of another element may be referred as such, in one example.

The following claims particularly point out certain combinations and sub-combinations regarded as novel and non-obvious. These claims may refer to "an" element or "a first" element or the equivalent thereof. Such claims should be understood to include incorporation of one or more such elements, neither requiring nor excluding two or more such elements. Other combinations and sub-combinations of the disclosed features, functions, elements, and/or properties may be claimed through amendment of the present claims or through presentation of new claims in this or a related application. Such claims, whether broader, narrower, equal, or different in scope to the original claims, also are regarded as included within the subject matter of the present disclosure.

The invention claimed is:

1. A rotating module, comprising:
   two rotating arms; and
   a bracket, having a track groove and located between the two rotating arms, wherein the two rotating arms are capable of rotating around the bracket with rotation centers of the two rotating arms; wherein
   each rotating arm comprises:
   a first rotating piece, wherein a first end of the first rotating piece is located in the track groove; and
   a second rotating piece, rotatably connected with the bracket and a second end of the first rotating piece respectively, wherein the second end is an opposite end of the first end;

when the rotating module is in a folded state, a rotation center of the first rotating piece is a first position on a groove wall of the track groove;

when the rotating module is in an unfolded state, the rotation center of the first rotating piece is a second position on the groove wall of the track groove, and the second position is located between a center position of the track groove and the first position; and the rotation center of the first rotating piece is one rotation center of the rotating arm;

wherein the second rotating piece further has: a groove, and the groove wall of the groove is in an arc shape; and wherein the second end of the first rotating piece is located in the groove.

2. The rotating module according to claim 1, wherein the groove wall of the track groove has: a first mounting hole;

the second rotating piece has: an axle hole aligned with the first mounting hole; and the rotating module further comprises: a central spindle, wherein the central spindle penetrate through the first mounting hole and the axle hole.

3. The rotating module according to claim 1, wherein the groove wall of the track groove is in an elliptic arc shape or in a circular arc shape.

4. The rotating module according to claim 1, wherein the first rotating piece further comprises:

a first tooth part, located in a region other than the first end and the second end of the first rotating piece; and each rotating arm further comprises:

a first gear structure, meshing with the first tooth part.

5. The rotating module according to claim 4, wherein the first rotating piece further comprises: a hinge pin; and the rotating module further comprises:

a connecting piece, having at least two connecting holes, wherein the at least two connecting holes respectively accommodate the hinge pin and a gear shaft of the first gear structure to limit separation of the first gear structure from the first tooth part.

6. The rotating module according to claim 4, wherein the two rotating arms further comprise:

a supporting frame, connected with the first gear structure and having a mounting position, wherein the mounting position is configured to be connected with a shell of an electronic device.

7. The rotating module according to claim 6, wherein the two rotating arms further comprise:

a connecting rod, having a first part and a second part connected with the first part, wherein the first part comprises a second tooth part, and the second part is connected with the supporting frame; and a second gear structure, wherein a gear shaft of the second gear structure is connected with the bracket, and the second gear structure meshes with the second tooth part; and the second gear structures of the two rotating arms mesh with each other.

8. The rotating module according to claim 7, wherein the supporting frame comprises:

a first supporting frame body, having a mounting position and connected with the first gear structure; and a second supporting frame body, connected with the first supporting frame body and having a sliding groove; and the second part of the connecting rod is located in the sliding groove.

9. The rotating module according to claim 7, wherein the groove wall of the track groove has: a second mounting hole;

the connecting rod further has: a through hole; and the rotating module further comprises: a lever pin, penetrating through the through hole and the second mounting hole, wherein the lever pin is also used as a rotating shaft of the second tooth part during meshing rotation.

10. An electronic device, comprising:

a first shell;

a second shell; and a rotating module, wherein the rotating module comprises:

two rotating arms; and a bracket, having a track groove and located between the two rotating arms, wherein the rotating arms are capable of rotating around the bracket with rotation centers of the rotating arms; wherein each rotating arm comprises:

a first rotating piece, wherein a first end of the first rotating piece is located in the track groove; and a second rotating piece, rotatably connected with the bracket and a second end of the first rotating piece respectively, wherein the second end is an opposite end of the first end;

when the rotating module is in a folded state, a rotation center of the first rotating piece is a first position on a groove wall of the track groove;

when the rotating module is in an unfolded state, the rotation center of the first rotating piece is a second position on the groove wall of the track groove, and the second position is located between a center position of the track groove and the first position; and the rotation center of the first rotating piece is one rotation center of the rotating arm;

the first shell and the second shell are respectively connected with one of the rotating arms;

wherein the second rotating piece further has: a groove, and the groove wall of the groove is in an arc shape; and wherein the second end of the first rotating piece is located in the groove.

\* \* \* \* \*